United States Patent
Paton et al.

(12) 
(10) Patent No.: US 6,605,513 B2
(45) Date of Patent: Aug. 12, 2003

(54) METHOD OF FORMING NICKEL SILICIDE USING A ONE-STEP RAPID THERMAL ANNEAL PROCESS AND BACKEND PROCESSING

(75) Inventors: Eric N. Paton, Morgan Hill, CA (US); Ercan Adem, Sunnyvale, CA (US); Jacques J. Bertrand, Capitola, CA (US); Paul R. Besser, Austin, TX (US); Matthew S. Buynoski, Palo Alto, CA (US); John Clayton Foster, Mountain View, CA (US); Paul L. King, Mountain View, CA (US); George Jonathan Kluth, Sunnyvale, CA (US); Minh Van Ngo, Fremont, CA (US); Christy Mei-Chu Woo, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 84 days.

(21) Appl. No.: 09/729,699

(22) Filed: Dec. 6, 2000

(65) Prior Publication Data

US 2002/0068408 A1 Jun. 6, 2002

(51) Int. Cl.[7] ............................................. H01L 21/336

(52) U.S. Cl. ...................................................... 438/299

(58) Field of Search ................................ 438/308, 581, 438/582, 583, 595, 655, 656, 662, 663, 664

(56) References Cited

U.S. PATENT DOCUMENTS

| | | | | |
|---|---|---|---|---|
| 5,780,361 A | * | 7/1998 | Inoue | 438/683 |
| 5,953,612 A | | 9/1999 | Lin et al. | 438/299 |
| 6,071,782 A | * | 6/2000 | Maa et al. | 438/301 |
| 6,096,647 A | * | 8/2000 | Yang et al. | 438/682 |
| 6,156,654 A | * | 12/2000 | Ho et al. | 438/683 |
| 6,180,469 B1 | * | 1/2001 | Pramanick et al. | 438/299 |

FOREIGN PATENT DOCUMENTS

| | | |
|---|---|---|
| EP | 0 831 521 A2 | 3/1999 |
| EP | 0 836 223 A2 | 4/1999 |
| EP | 0 936 664 A2 | 8/1999 |

* cited by examiner

*Primary Examiner*—David Nelms
*Assistant Examiner*—Quoc Huang

(57) ABSTRACT

A self-aligned silicide process that can accommodate a low thermal budget and form silicide regions of small dimensions in a controlled reaction. In a first temperature treatment, nickel metal or nickel alloy is reacted with a silicon material to form at least one high resistance nickel silicide region. Unreacted nickel is removed. A dielectric layer is then deposited over a high resistance nickel silicide regions. In a second temperature treatment, the at least one high resistance nickel silicide region and dielectric layer are reacted at a prescribed temperature to form at least one low resistance silicide region and process the dielectric layer. Bridging between regions is avoided by the two-step process as silicide growth is controlled, and unreacted nickel between silicide regions is removed after the first temperature treatment. The processing of the high resistance nickel silicide regions and the dielectric layer are conveniently combined into a single temperature treatment.

10 Claims, 5 Drawing Sheets

METHOD OF FORMING NICKEL SILICIDE USING A ONE-STEP RAPID THERMAL ANNEAL PROCESS AND BACKEND PROCESSING

FIELD OF THE INVENTION

The present invention relates to a method of forming nickel silicide using a one step rapid thermal anneal and backend processing process.

DESCRIPTION OF RELATED ART

Forming self-aligned suicides is well known in the semiconductor processing industry as a way of integrating low resistivity material on predefined regions of semiconductor structures that are being processed to form semiconductor devices. More specifically, self-aligned silicide processing is a method of reacting metal with silicon regions of a semiconductor structure to form silicide regions. Self-aligned silicides can be selectively formed on semiconductor structures without the necessity of patterning or etching the deposited silicide to define low resistively regions.

Titanium, cobalt, and nickel are among the metals that have been reacted with silicon materials to form self-aligned silicides on semiconductor structures. Titanium silicide can be formed on a semiconductor structure in a self-aligned manner. FIG. 1 shows an exemplary silicon substrate 10 with a polycrystalline silicon region 16 formed on the silicon substrate 10. Adjacent to the polycrystalline silicon region 16 are spacers 14. The spacers 14 can be an oxide, nitride, or other ceramic material. The silicon substrate 10 has active regions 12 that can be characterized as being doped silicon and may function as the source and drain of a transistor. In FIG. 2, a layer of titanium metal or titanium alloy 18 is deposited over the semiconductor structure of FIG. 1. The semiconductor structure of FIG. 2 then undergoes a first rapid thermal anneal (RTA) at temperatures ranging from 550° C. to 750° C. FIG. 3 shows the semiconductor structure of FIG. 2 after this first rapid thermal anneal. Some of the titanium metal or titanium alloy layer 18 reacts with the polycrystalline region 16 to form high resistivity silicide (TiSi$_2$) regions 22. Additionally, some of the titanium layer 18 reacts with the silicon of the active region 12 to form high resistivity titanium silicide (TiSi$_2$) region 20. During the first rapid thermal anneal, none of the titanium layer 18 reacts with the spacer 14. As silicide does not form on the spacers, the high resistivity titanium silicide regions 20, 22 are formed in a self-aligned manner, as it is not necessary to pattern or etch silicide off the spacers to define the titanium silicide regions 20, 22 on the polycrystalline region 16 and active region 12. It is undesirable to form silicide on the spacers 14 as this leads to bridging between the gate and the source/drain 12. Unreacted titanium in metal layer 19 of FIG. 3 is stripped away using conventional stripping techniques. FIG. 4 shows the semiconductor structure of FIG. 3 after the unreacted metal layer 19 is stripped away. The high resistivity titanium silicide regions 20, 22 remain integrated into the semiconductor structure after the wet strip of the unreacted metal 19. The semiconductor structure of FIG. 4 then undergoes a second rapid thermal anneal at temperatures ranging from 750° C. to 900° C. FIG. 5 shows the semiconductor structure of FIG. 4 after the second rapid thermal anneal where the high resistivity titanium silicide regions 20, 22 are reacted to form low resistivity silicide (TiSi$_2$) regions 24, 26. The low resistivity silicide titanium regions 24 are formed on the polycrystalline silicon region 16 and low resistivity titanium silicide regions 26 are formed on the active region 12 of the silicon substrate 10.

There are several disadvantages of the above described two-step rapid thermal anneal process using titanium metal or titanium alloy to form low resistivity titanium silicide in a self-aligned manner. As semiconductor technology has advanced, it has become desirable for the dimensions of certain semiconductor structures to become smaller. For example, it is desirable for the polycrystalline region 16 and spacers 14 to be formed as small as possible on semiconductor substrate 10 to enhance performance of semiconductor devices using this type of structure. For example, transistors adopting this general semiconductor structure are designed and implemented with such small dimensions to enable the transistor to execute computer instructions at faster speeds. It is often necessary to form low resistivity titanium silicide regions on semiconductor structures to enable electrical interconnection of semiconductor components of a semiconductor device. Such exemplary regions are the active regions 12 and polycrystalline region 16 of FIG. 5. The use of titanium in a two step rapid thermal anneal process to form titanium silicide in a self-aligned manner is not effective with semiconductor structures of smaller dimensions because titanium metal or titanium alloy layer does not fully react with the small surfaces of silicon materials such as the polycrystalline silicon region 16 and active regions 12 of FIGS. 1–5. The reasoning behind this shortcoming of titanium in a self-aligned silicide processes is that the reaction of titanium with silicon materials are dominated by nucleation of the silicide and therefore the silicide does not form in a consistent manner. As exemplified in FIGS. 3–5, the reaction of titanium metal or titanium alloy with the silicon materials forms titanium silicide regions that are scattered, inconsistent, and not adequate for the formation of silicide regions in some semiconductor devices, such as transistors. As not all of the titanium metal or titanium alloy reacts on the silicon material surfaces of small semiconductor structures, the reaction of titanium with the silicon based material does not adequately lower the resistivity of the silicon based components of the semiconductor structure. Hence, the use of titanium does not adequately serve the objectives of forming silicides in a self-aligned manner for relatively small semiconductor structures. This limitation of the use of titanium in self-aligned suicides is often referred to as line width dependence.

Another disadvantage of the use of titanium metal or titanium alloy to form titanium suicides in a semiconductor structure is that the temperatures at which the first and second rapid thermal anneal undergo are relatively high. These high temperatures limit the designs of the semiconductor structures utilizing self-aligned suicides. High temperatures can induce stress on the semiconductor structure and can destroy the functionality of the semiconductor device. Other disadvantages of a two-step rapid thermal anneal process to form titanium silicide are also known.

Cobalt can also be reacted with silicon materials, such as polycrystalline silicon or a silicon substrate, to form self-aligned cobalt silicide regions in a semiconductor structure. FIG. 6, for example, shows a semiconductor substrate 10 with active regions 12 and a polycrystalline region 16 formed on the silicon substrate 10. Spacers 14 are formed on the silicon substrate 10 adjacent to the polycrystalline region 16. A layer of cobalt metal or cobalt alloy 28 is formed on the semiconductor structure of FIG. 6, as shown in FIG. 7. The semiconductor structure of FIG. 7 undergoes a first rapid thermal anneal at temperatures ranging from 450° C. to 510° C. FIG. 8 shows high resistivity cobalt silicide (CoSi) regions 30, 32 formed on the polycrystalline region 16 and the active regions 12 as a product of the first rapid thermal anneal process. Any unreacted cobalt metal or cobalt alloy 29 is wet stripped away using conventional stripping techniques. FIG. 9 shows the semiconductor structure of FIG. 8 with high resistivity cobalt silicide 30, 32 regions formed on the polycrystalline region 16 and the active region 12 of the substrate 10 after unreacted cobalt metal or cobalt alloy 29 is stripped away. No cobalt silicide is formed on the spacers 14; this feature exemplifies the self-alignment characteristic of self-aligned silicides. Further, the stripping does not strip away any of the formed cobalt silicide and only strips the unreacted cobalt metal or cobalt alloy 29. The semiconductor structure of FIG. 9 then undergoes a second rapid thermal anneal at temperatures ranging from 760° C. to 840° C. The second rapid thermal anneal reacts the high resistivity cobalt silicide regions 30, 32 to form low resistivity cobalt silicide ($CoSi_2$) regions 34, 36. FIG. 10 shows low resistivity cobalt silicide regions 34, 36 formed on the polycrystalline silicon region and the active region 12 of the substrate 10.

There are several disadvantages of using cobalt metal or cobalt alloy reacted with silicon material to produce cobalt silicides in semiconductor processing. One disadvantage is that the two-step rapid thermal anneal process that is necessary to form low resistivity $CoSi_2$ require relatively high temperatures. These relatively high temperatures may not be compatible or desirable with semiconductor processing of pre-existing components of the semiconductor structure. More particularly, these high temperatures may induce stress on other semiconductor components and/or diffuse materials of the existing semiconductor structure.

The use of nickel to form self-aligned silicides has been established using a one-step rapid thermal anneal process. FIG. 11, for example, shows a silicon substrate 10 with active regions 12. A polycrystalline silicon region 16 is formed on the silicon substrate 10 and spacers 14 are formed adjacent to the polycrystalline silicon region 16. A layer of nickel metal or nickel alloy is formed on the exemplary semiconductor structure of FIG. 11. FIG. 12, for example, shows a layer of nickel metal or nickel alloy 38 formed over the semiconductor structure of FIG. 11. A single rapid thermal anneal is conducted at temperatures ranging from 350° C. to 700° C. in order to react the nickel metal or nickel alloy to form a silicide with a relatively low resistance. FIG. 13, for example, depicts silicide regions 40, 42 formed from the single rapid thermal anneal. At the necessary rapid thermal anneal temperatures ranging from 350° C. to 700° C., undesirable bridging may occur between the nickel silicide formed on polycrystalline silicon region 16 and the nickel silicide formed on the active regions 12. The unreacted nickel in layer 4A is stripped, leaving the structure of FIG. 14.

There are certain concerns arising from the one-step rapid thermal anneal of nickel silicide. One concern is the relatively uncontrollable reaction and excessive formation of nickel silicide, which may cause the aforementioned bridging between the nickel silicide 40 formed on the polycrystalline silicon 16 and the nickel silicide 42 formed on the active regions 12, as seen in FIG. 14.

SUMMARY OF INVENTION

There is a need for a self-aligned silicide process that can accommodate a low thermal budget during processing and with a controlled silicidization reaction of metal or alloy with silicon material. Further, there is a need for a self-aligned silicide process that can combine processing steps during the fabrication of semiconductor devices.

These and other needs are met by embodiments of the present invention which provide a one-step temperature treatment process and backend processing to form self-aligned nickel silicide regions in a semiconductor structure. The present invention includes depositing a layer of nickel metal or nickel alloy on silicon material. At least a section of the nickel metal or alloy is reacted with at least a section of the silicon layer at a first temperature for a first period of time to form at least one high resistance nickel silicide layer. Unreacted nickel metal or nickel alloy is removed from the semiconductor structure leaving the at least one high resistance suicide layer integrated into the semiconductor structure. A dielectric layer is then deposited over the at least one high resistance nickel silicide layer. The dielectric layer and the at least one high resistance nickel silicide layer undergo a second temperature for a second period of time to form at least one low resistance nickel silicide layer.

The present invention has the advantage of producing silicide at a relatively low temperature. This feature reduces stress on other pre-existing semiconductor components of a semiconductor structure. This feature also allows the semiconductor processing of more complicated and useful semiconductor structures. Another advantage of the present invention is that the nickel metal layers react with the silicon based material layers in a controlled manner. This is an important and useful attribute as enough nickel silicide is reacted such that line width dependence is not an obstacle and bridging between silicide regions formed on the same semiconductor structure is prevented. Further, the present invention has the advantage of combining the processing of the high resistance nickel silicide layer and processing of the dielectric layer in a single step of undergoing a second temperature for a second period of time.

The foregoing and other features, aspects, and advantages of the present invention will become more apparent from the following detailed description of the present invention taken in conjunction with the accompanying drawings.

DETAILED DESCRIPTION OF THE INVENTION

The present invention relates to a one-step temperature treatment and backend processing for forming nickel silicide on a semiconductor structure. The process of the present invention includes depositing a nickel metal or nickel alloy on a silicon layer. The nickel metal or nickel alloy and the silicon layer are reacted at a first temperature for a first period of time to form at least one high resistance nickel silicide region. The unreacted nickel metal or nickel alloy is then stripped away and at least one high resistance nickel silicide region remains integrated into the semiconductor structure. A dielectric layer is then deposited over the higher resistance nickel silicide regions. The at least one high resistance nickel silicide region and dielectric layer undergo a second temperature for a second period of time to form at least one low resistance nickel silicide region. By employing a one-step temperature treatment and backend processing process, instead of a single step rapid thermal anneal process typically employed in turning nickel silicide, the present invention mitigates bridging between silicide regions of a semiconductor device and reduces the number of steps necessary to process a given semiconductor device.

Figure 1:
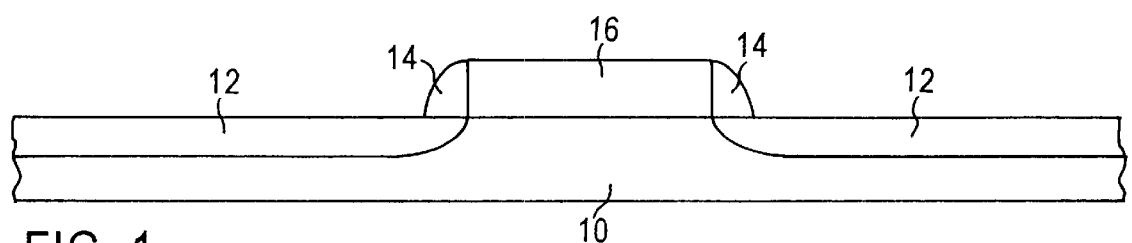
FIG. 1 is prior art diagram of a typical semiconductor structure prior to the formation of a silicide.
Figure 2:
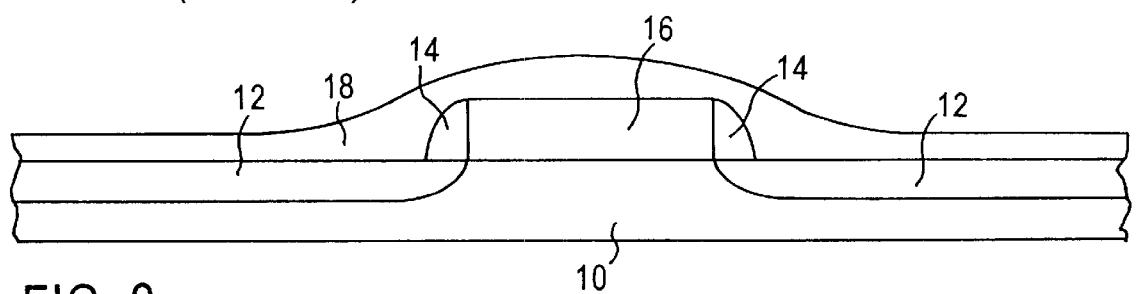
FIG. 2 is a prior art diagram of the semiconductor structure of FIG. 1 with a titanium metal or titanium alloy layer deposited on the semiconductor structure.
Figure 3:
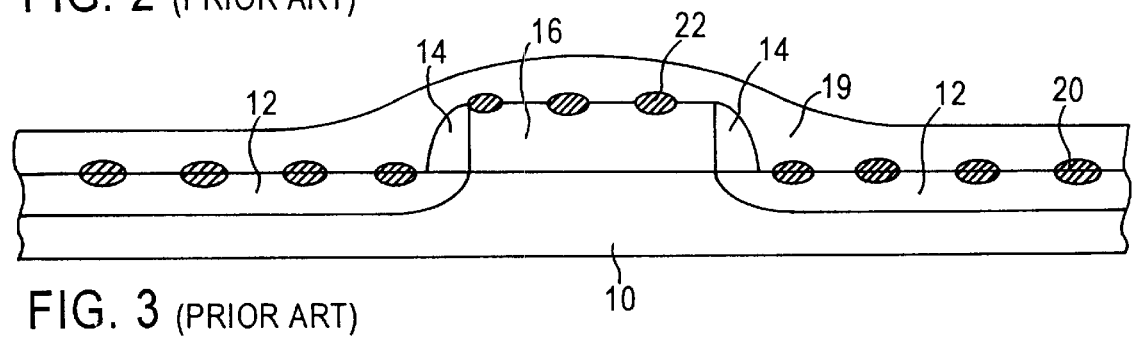
FIG. 3 is a prior art diagram of the semiconductor structure of FIG. 2 after a first rapid thermal anneal.
Figure 4:
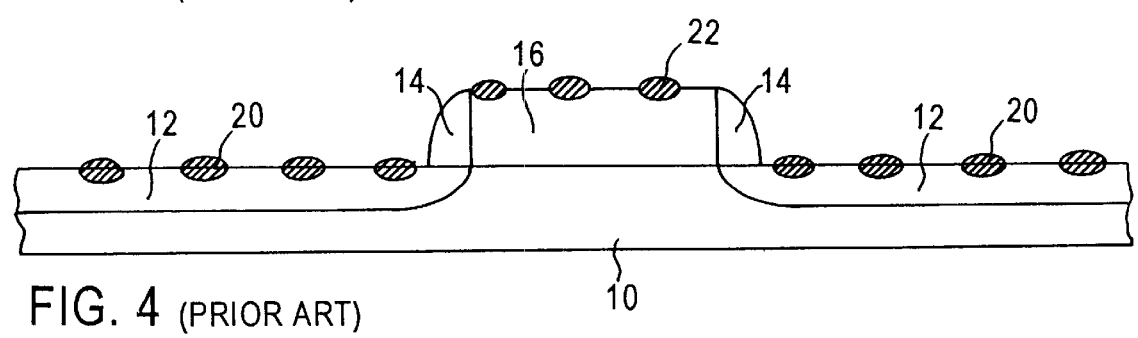
FIG. 4 is a prior art diagram of the semiconductor structure of FIG. 3 after the removal of unreacted titanium metal or titanium alloy.
Figure 5:
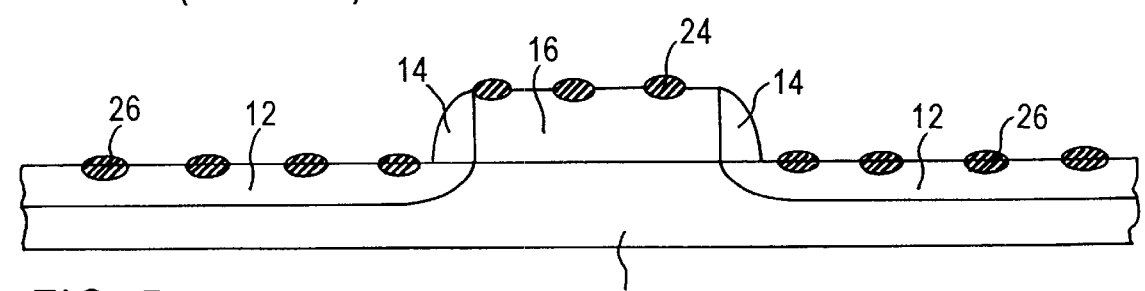
FIG. 5 is a prior art diagram of the semiconductor structure of FIG. 4 after a second rapid thermal anneal.
Figure 6:
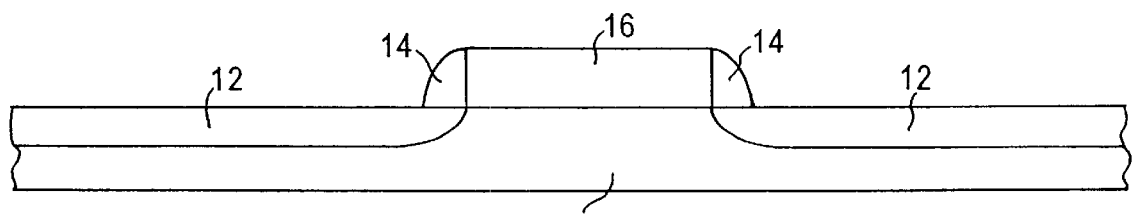
FIG. 6 is a prior art diagram of a typical semiconductor structure prior to the formation of a silicide.
Figure 7:
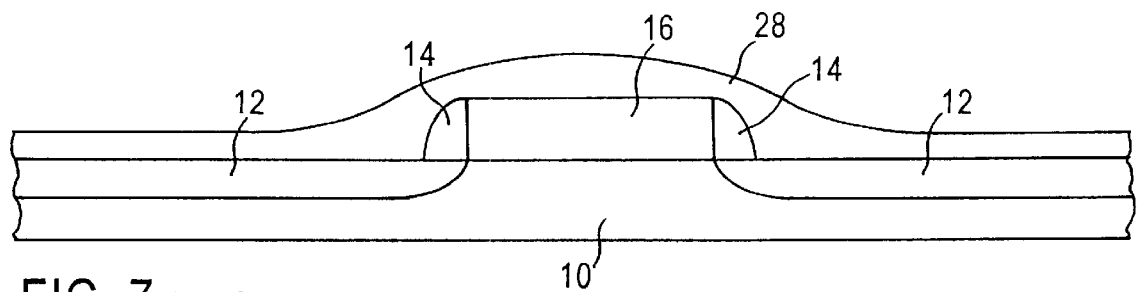
FIG. 7 is a prior art diagram of the semiconductor structure of FIG. 6 with a layer of cobalt metal or cobalt alloy deposited on the semiconductor structure.
Figure 8:
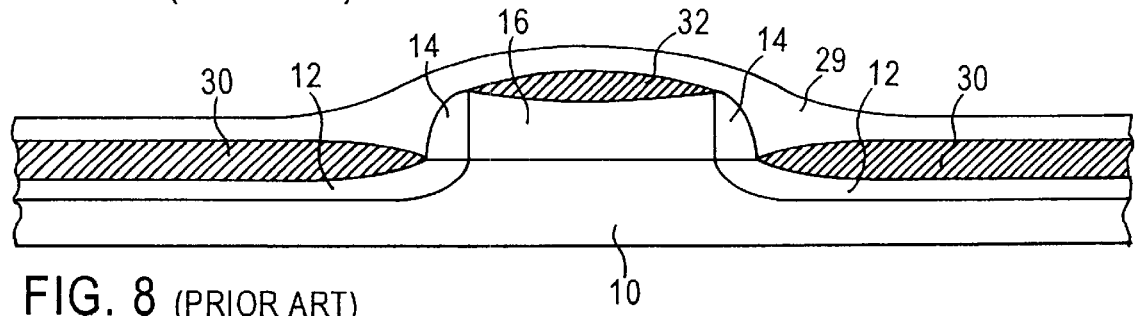
FIG. 8 is a prior art diagram of the semiconductor structure of FIG. 7 after a first rapid thermal anneal.
Figure 9:
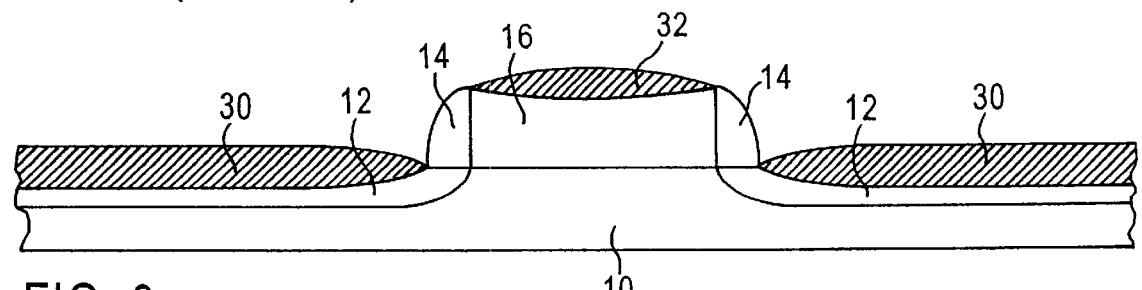
FIG. 9 is a prior art diagram of the semiconductor structure of FIG. 8 after the unreacted cobalt metal or cobalt alloy is stripped away.
Figure 10:
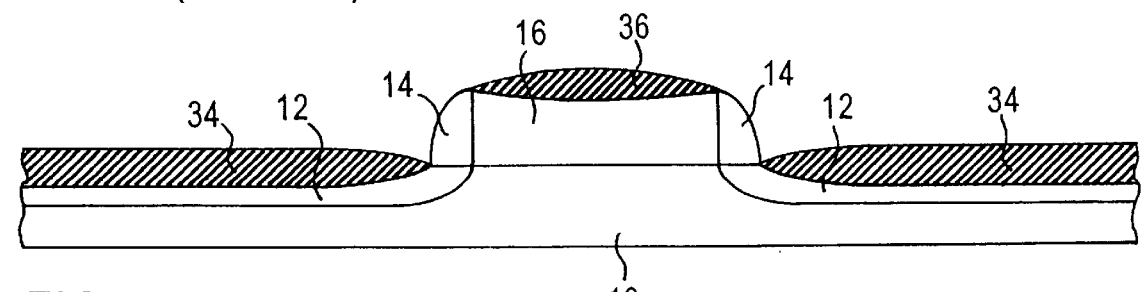
FIG. 10 is a prior art diagram of the semiconductor structure of FIG. 9 after a second rapid thermal anneal.
Figure 11:
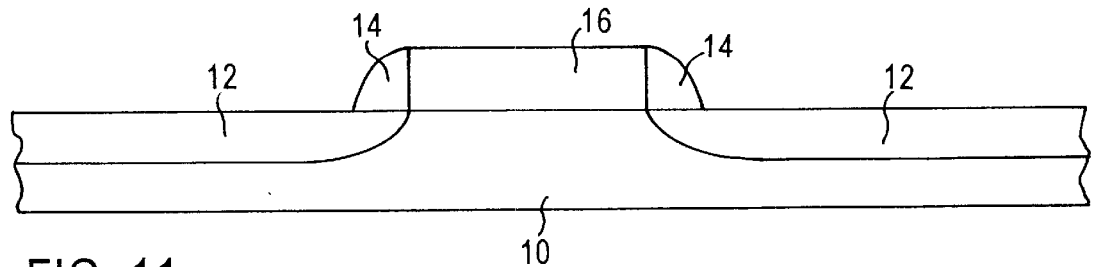
FIG. 11 is a prior art diagram of a typical semiconductor structure prior to the formation of a silicide.
Figure 12:
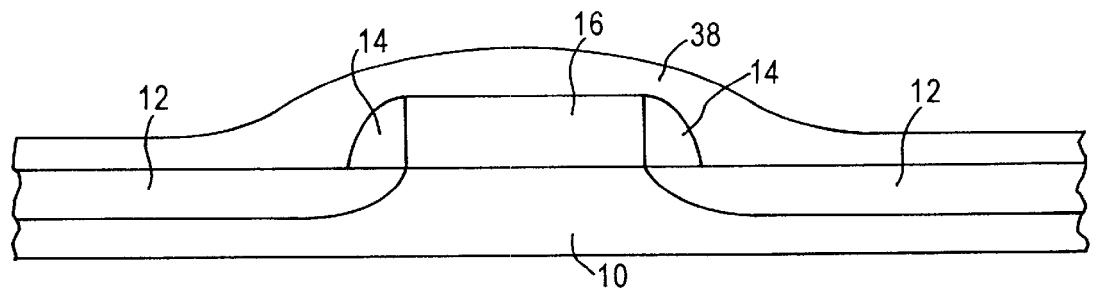
FIG. 12 is a prior art diagram of the semiconductor structure of FIG. 11 after a layer of nickel metal or nickel alloy is deposited on the semiconductor structure.
Figure 13:
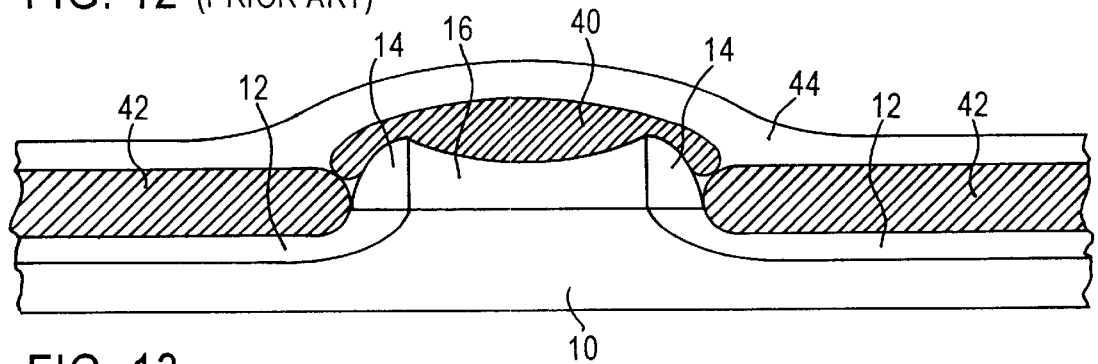
FIG. 13 is a prior art diagram of the semiconductor structure of FIG. 12 after a single rapid thermal anneal.
Figure 14:
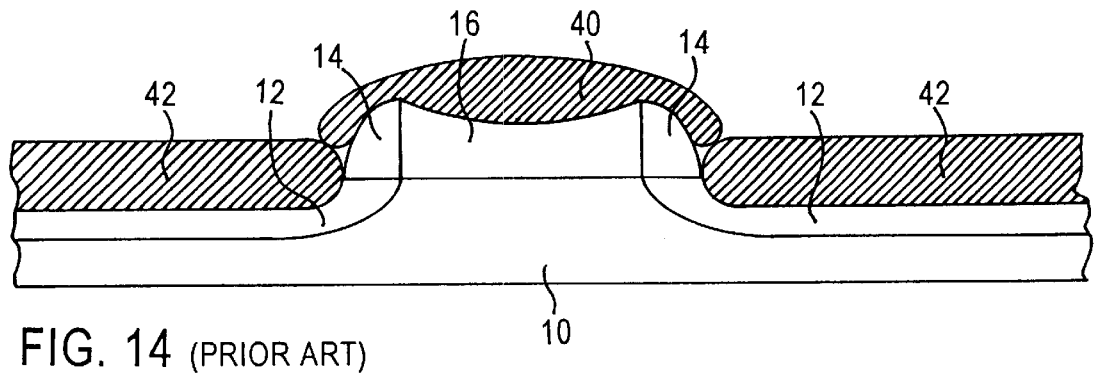
FIG. 14 is a prior art diagram of the semiconductor structure of FIG. 13 after the unreacted nickel metal or nickel alloy has been stripped away.
Figure 15:
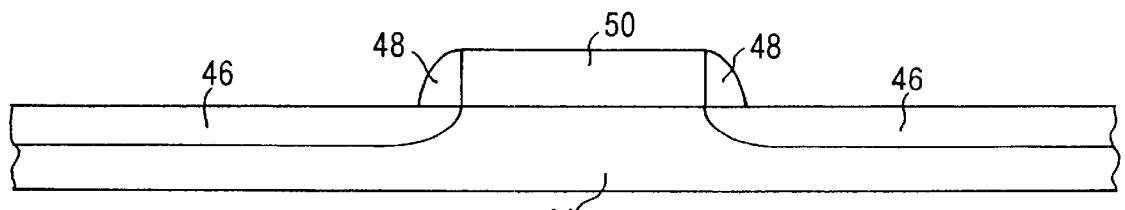
FIG. 15 is a diagram of a semiconductor structure.

FIG. 15 is an exemplary semiconductor structure. The semiconductor structure includes a silicon substrate 44 with a polycrystalline silicon region 50 formed on the silicon substrate 44. Adjacent to the polycrystalline region 50 are spacers 48. The silicon substrate 44 may also include active regions. The active regions may be characterized by doped silicon. The polycrystalline region 50 formed on the silicon substrate 44 may serve as a gate for a transistor and the active regions 46 may serve as the source and the drain for a transistor. The spacers 48 may be formed from an oxide, nitride, or other ceramic material. The function of the spacers 48 may be to isolate the polycrystalline region 50 from the active regions 46 or to isolate the gate of a transistor from the source and drain of a transistor.

Figure 16:
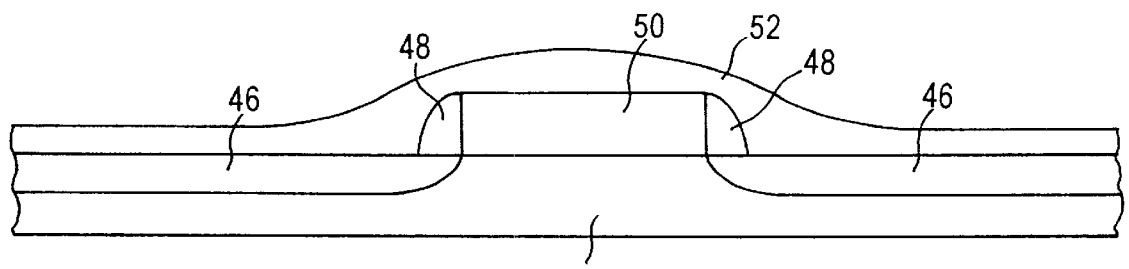
FIG. 16 is a diagram of the semiconductor structure of FIG. 15 with a layer of nickel metal or nickel alloy deposited on the semiconductor structure.
Figure 17:
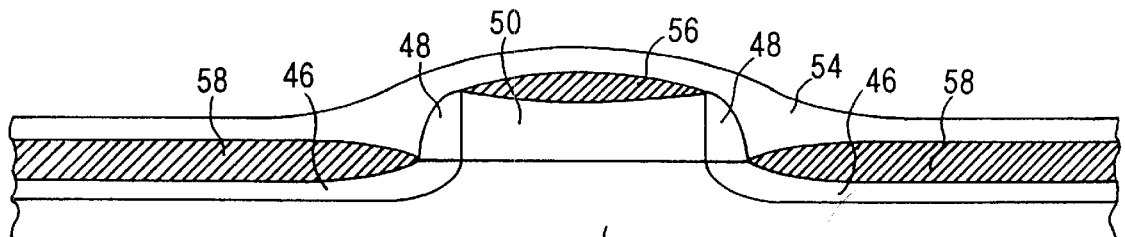
FIG. 17 is a diagram of the semiconductor structure of FIG. 16 after a first temperature treatment.

FIG. 16 shows the semiconductor structure of FIG. 15 after nickel metal or nickel alloy 52 has been deposited in a conventional manner on the semiconductor structure. FIG. 17 depicts the semiconductor structure of FIG. 16 after a first temperature treatment that reacts the nickel metal or nickel alloy 52 with the polycrystalline region 50 and active regions 46 to form high resistivity nickel silicide ($Ni_3Si$ or $Ni_2Si$) regions 56. The first temperature treatment is at temperatures ranging from 250° C. to 350° C. This temperature treatment is at a relatively low temperature compared to the single step rapid thermal anneal temperatures of the prior art employed to create nickel silicide, or to the temperature employed in the first rapid thermal anneal of prior art titanium silicide or prior art cobalt silicide. Further, the first temperature treatment can be a rapid thermal anneal characterized by fast ramp up and fast ramp down of the temperature over a relatively short period of time. Exemplary annealing processes that can be used for the rapid thermal anneal are a laser annealing process, a lamp heated annealing process, or other radiative annealing process. The first temperature treatment may be for a first period of time ranging from 15 seconds to 90 seconds, but preferably for 30 seconds to 60 seconds.

Figure 18:
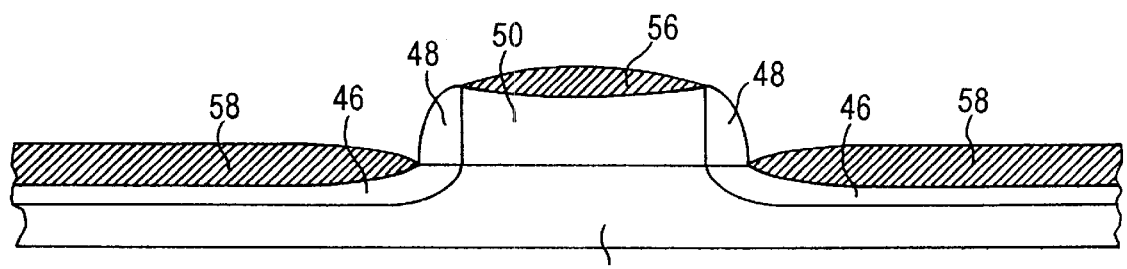
FIG. 18 is a diagram of the semiconductor structure of FIG. 17 after the unreacted nickel metal or nickel alloy has been stripped away.

In FIG. 18, the semiconductor structure of FIG. 17 is stripped of unreacted nickel metal or nickel alloy 54 by a conventional stripping technique. Exemplary conventional stripping techniques include use of a sulfuric peroxide, hydrochloric acid, nitric acid, phosphoric acid, or mixtures of these stripping agents. The stripping of the unreacted nickel metal or nickel alloy 54 does not remove the relatively high resistance nickel silicide regions 56, 58 formed in the first temperature treatment. Further, none of the nickel metal or nickel alloy 52 is reacted on the spacers 48, as the spacers are formed of an oxide or nitride or other such material. The low temperature used in this stage of nickel silicide formation prevents uncontrolled silicide formation on the spacers 48, in contrast to what can occur in a typical single step nickel silicide formation process. This feature serves the function of self-alignment, as it is not necessary for the nickel silicide areas to be etched in order to isolate nickel silicide regions 56, 58 at the desirable locations on the semiconductor structure.

Figure 19:
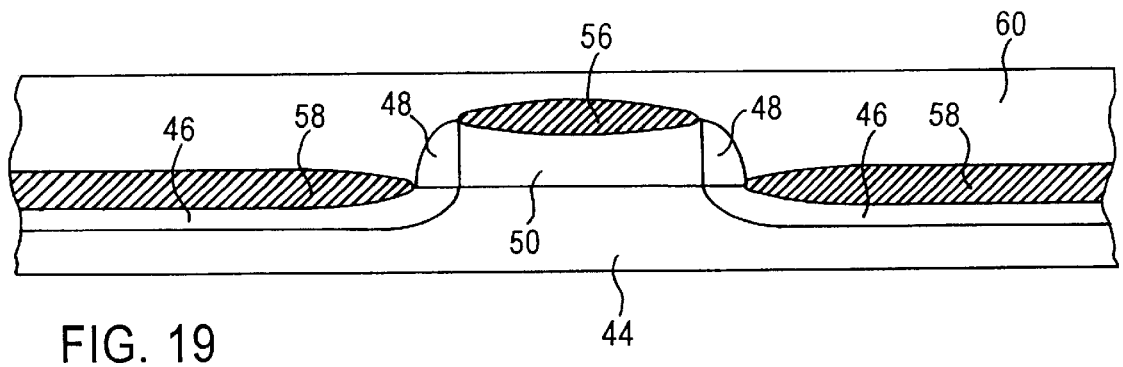
FIG. 19 is a diagram of the semiconductor structure of FIG. 18 after the deposition of a dielectric layer.

FIG. 19 is a depiction of a dielectric layer deposited over the semiconductor structure of FIG. 18. The dielectric layer 16 is a further component of the semiconductor structure and may be unrelated to the formation of silicide in the semiconductor structure. Dielectric layer 60 may serve as an isolation layer prior to processing through a temperature treatment.

Figure 20:
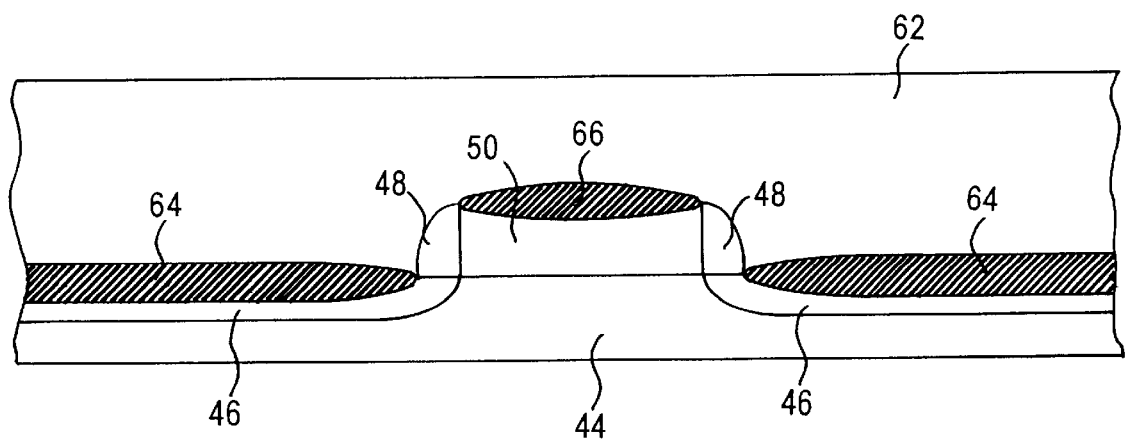
FIG. 20 is a diagram of a semiconductor structure of FIG. 19 after a second temperature treatment.

FIG. 20 is a depiction of the semiconductor structure of FIG. 19 after a second temperature treatment in accordance with an exemplary embodiment of the present invention. The second temperature treatment is at temperatures ranging from 350° C. to 700° C. Further, the second heat treatment can be a rapid thermal anneal characterized by a fast ramp up and ramp down to the target temperature of the temperature treatment. The high resistance nickel silicide regions of the embodiment of FIG. 18 are reacted ("transformed") to form low resistance nickel silicide regions (NiSi) 52, 54. Further, the second temperature treatment also serves to process dielectric layer 60 of FIG. 19 to layer 62 of FIG. 20. The processing of silicide regions 56, 58 and dielectric layer 60 is backend processing. Backend processing is a term of art used to describe a process step accomplished in a subsequent process step. In certain preferred embodiments, the second temperature treatment is at temperatures ranging from about 350° C. to about 700° C. in order to form the lowest resistivity nickel silicide and maintain a reasonable low thermal budget. The second temperature treatment is a relatively low temperature compared to the rapid thermal anneal temperatures required by the prior art for other types of suicides. The time period for the second temperature treatment can be between 15 seconds and 15 minutes.

The present invention offers a self-aligned silicide process that can accommodate a low thermal budget and form silicide regions of small dimensions in a controlled reaction. The present invention achieves this through a one-step temperature treatment forming high resistance nickel silicide and backend processing to process a dielectric layer and form low resistance nickel silicide from the high resistance nickel silicide. In a first temperature treatment, nickel metal or nickel alloy is reacted with a silicon material to form high resistance nickel silicide regions unreacted metal or nickel alloy is then stripped from the semiconductor structure. A dielectric layer is then deposited over the high resistance nickel silicide regions. In a second temperature treatment, the high resistance nickel silicide regions are reacted at a prescribed temperature to form low resistance silicide regions and at the same time the dielectric layer is processed. The use of a two-step temperature treatment allows for the formation of silicide of small dimensions in a controlled manner and at a relatively low temperature. The present invention can effectively form silicide and accommodate a low thermal budget during semiconductor processing while, largely avoiding the bridging exhibited by prior art techniques of forming nickel silicide. Further, the present invention can combine the processing of the dielectric layer and the high resistance silicide region in the same temperature treatment step.

Although the present invention has been described and illustrated in detail, it is to be clearly understood that the same is by way of illustrating and example only and is not to be taken by way of limitation, the scope of the present invention being limited only by the terms of the appended claims.

What is claimed is:

1. A semiconductor processing process, comprising the steps of:

depositing a nickel metal layer on at least one silicon layer;

reacting the nickel metal layer with at least a section of the at least one silicon layer at a first temperature for a first period of time to form at least one high resistance silicide layer;

removing unreacted nickel of the nickel metal layer;

depositing a dielectric layer over the at least one silicon layer and the at least one high resistance silicide layer; and reacting the at least one high resistance layer at a second temperature for a second period of time to form a low resistance layer.

2. The semiconductor processing process of claim 1, wherein at least one silicon layer comprises polycrystalline silicon.

3. The semiconductor processing process of claim 1, wherein the first temperature is in the range of about 250° C. to about 350° C.

4. The semiconductor processing process of claim 1, wherein the second temperature is in the range of about 350° C. to about 700° C.

5. The semiconductor processing process of claim 1, wherein the high resistance layer is at least one of $Ni_3Si$ and $Ni_2Si$ and the low resistance layer is NiSi.

6. The semiconductor processing process of claim 1, wherein the first period of time is about 15 seconds to about 90 seconds and the second period of time is about 15 seconds to about 15 minutes.

7. The semiconductor processing process of claim 1, wherein the first period of time is about 30 seconds to about 60 seconds and the second period of time is about 1 minute to about 15 minutes.

8. The semiconductor processing process of claim 1, wherein the first reacting step and the second reacting step forms a one-step rapid thermal anneal with backend processing process.

9. The semiconductor processing process of claim 8, wherein the one-step rapid thermal anneal with backend processing process comprises a laser annealing process.

10. The semiconductor processing process of claim 8, wherein the one-step rapid thermal anneal with backend processing process comprises a lamp heated annealing process.

* * * * *